United States Patent
Shimizu et al.

(10) Patent No.: US 10,135,437 B2
(45) Date of Patent: Nov. 20, 2018

(54) DRIVE CONTROL APPARATUS

(71) Applicant: DENSO CORPORATION, Kariya, Aichi-pref. (JP)

(72) Inventors: Hiroshi Shimizu, Kariya (JP); Kazuma Fukushima, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/819,178

(22) Filed: Nov. 21, 2017

(65) Prior Publication Data

US 2018/0145683 A1 May 24, 2018

(30) Foreign Application Priority Data

Nov. 21, 2016 (JP) .................................. 2016-225774

(51) Int. Cl.
| | |
|---|---|
| H03K 17/567 | (2006.01) |
| H03K 17/04 | (2006.01) |
| H03K 17/14 | (2006.01) |
| H02M 1/088 | (2006.01) |
| H02M 3/156 | (2006.01) |
| H02M 1/08 | (2006.01) |
| H02M 1/32 | (2007.01) |

(52) U.S. Cl.
CPC .......... *H03K 17/567* (2013.01); *H02M 1/088* (2013.01); *H02M 3/156* (2013.01); *H03K 17/0406* (2013.01); *H03K 17/14* (2013.01); *H02M 1/08* (2013.01); *H02M 2001/327* (2013.01)

(58) Field of Classification Search
None
See application file for complete search history.

(56) References Cited

U.S. PATENT DOCUMENTS

| | | | |
|---|---|---|---|
| 7,230,587 B2 * | 6/2007 | Onozawa ............... | G09G 3/296 315/169.3 |
| 9,041,456 B2 * | 5/2015 | Hasegawa .............. | H03K 17/12 327/108 |
| 9,787,301 B2 * | 10/2017 | Sato ...................... | H03K 17/567 |
| 2018/0145513 A1 * | 5/2018 | Kato ....................... | H01L 23/48 |

FOREIGN PATENT DOCUMENTS

JP 2014-027816 A 2/2014

* cited by examiner

*Primary Examiner* — Jeffery S Zweizig
(74) *Attorney, Agent, or Firm* — Oliff PLC (57) ABSTRACT

Parallely connected first and second switches respectively have first and second on resistances. The second on resistance is higher than the first on resistance in a lower range of current, and lower than the first on resistance in a higher range of current. A current obtaining unit obtains a current parameter indicative of an input current flowing through both the first and second switches. A low-current control unit controls, based on the obtained current parameter, switching operations of the first and second switches to correspondingly increase the number of times of turn-on of the first switch relative to the number of times of turn-on of the second switch, and prevent simultaneous turn-on of the first and second switches while a value of the input current is located within a predetermined low-level current region, the low-level current region being lower than the threshold current.

8 Claims, 6 Drawing Sheets

DRIVE CONTROL APPARATUS

CROSS REFERENCE TO RELATED APPLICATIONS

This application is based on and claims the benefit of priority from Japanese Patent Application 2016-225774 filed on Nov. 21, 2016, the disclosure of which is incorporated in its entirety herein by reference.

TECHNICAL FIELD

The present disclosure relates to drive control apparatuses for controlling drive of switches connected in parallel to each other.

BACKGROUND

For example, Japanese Patent Application Publication No. 2014-27816, referred to as a published patent document, discloses such a drive control apparatus. The drive control apparatus disclosed in the published patent document is configured to control drive of a MOSFET and an IGBT connected in parallel to each other. IGBTs have a higher on resistance than MOSFETs do while a current flowing therethrough is within a lower current region lower than a threshold current of the IGBTs. In addition, IGBTs have a lower on resistance than MOSFETs do while a current flowing therethrough is within a higher current region equal to or higher than the threshold current of the IGBTs.

SUMMARY

Specifically, the drive control apparatus disclosed in the published patent document turns on the MOSFET in the lower current region in accordance with a gate drive pulse, i.e. gate on pulse, every switching period and turns on the IGBT in the lower current region in accordance with a partial on pulse extracted from the gate on pulse. This gives priority to turn-on of the MOSFET over to turn-on the IGBT in the lower current region, resulting in a reduction of total loss generated from the set of the MOSFET and the IGBT in the lower current region.

In addition, the drive control apparatus disclosed in the published patent document turns on the IGBT in the higher current region in accordance with a gate on pulse, and turns on the MOSFET in the higher current region in accordance with a partial on pulse extracted from the gate on pulse. This gives priority to turn-on of the IGBT over to turn-on the MOSFET in the higher current region, resulting in a reduction of total loss generated from the set of the MOSFET and the IGBT in the higher current region.

There is room for improvement in controlling drive of switches connected in parallel to each other for the following reasons.

In the lower current region, the MOSFET is maintained in an on state for both the on period during which the partial on pulse is extracted from the on pulse for the IGBT and for the on period of the IGBT. That is, the MOSFET is always turned on every switching period. This may result in an increase of the amount of heat generated from the MOSFET to thereby increase the temperature of the MOSFET, resulting in an increase of the on resistance of the MOSFET. This may result in an increase of loss, for example, conduction loss, of the MOSFET.

Additionally, in the higher current region, the IGBT is maintained in the on state for both the on period during which the partial on pulse is extracted from the on pulse for the MOSFET and for the on period of the MOSFET. That is, the IGBT is always turned on every switching period. This may result in an increase of the amount of heat generated from the IGBT to thereby increase the temperature of the IGBT, resulting in an increase of the on resistance of the IGBT. This may result in an increase of loss, for example, conduction loss, of the IGBT.

The above problem of loss increase may occur for a pair of first and second switches in which 1. The first switch has a higher on resistance than the second switch does while a current flowing therethrough is within a lower current region lower than a threshold current of the first switch 2. The first switch has a lower on resistance than the second switch does while a current flowing therethrough is within a higher current region equal to or higher than the threshold current of the first switch In view of the circumstances set forth above, an exemplary aspect of the present disclosure seeks to provide drive control apparatuses for driving first and second switches connected in parallel to each other, each of which is capable of having lower loss generated from each of the first and second switches.

According to a first exemplary aspect of the present disclosure, there is provided a drive control apparatus for controlling a drive of a first switch and a second switch connected in parallel to each other. The first switch has a first on resistance, and the second switch has a second on resistance that is higher than the first on resistance in a lower range of current flowing therethrough. The lower range of current is lower than a predetermined threshold current, and the second on resistance is lower than the first on resistance in a higher range of current flowing therethrough. The higher range of current is higher than the predetermined threshold current. The drive control apparatus includes a current obtaining unit configured to obtain a current parameter indicative of an input current flowing through both the first and second switches. The drive control apparatus includes a low-current control unit configured to control, based on the obtained current parameter, on-off switching operations of the first and second switches to correspondingly 1. Increase the number of times of turn-on of the first switch relative to the number of turn-on of the second switch 2. Prevent simultaneous turn-on of the first and second switches while a value of the input current is located within a predetermined low-level current region, the low-level current region being lower than the threshold current.

In the low-level current region set to be lower than the threshold current, keeping the second switch in an off state has a lower impact on the controllability of current caused to flow through the first and second switches than turning on the second switch in a period during which the first switch is to be turned on.

From this viewpoint, the low-current control unit controls, based on the obtained current parameter, repetitive on-off switching operations of the first and second switches in the low-level current region to correspondingly 1. Increase the number of turn-on of the first switch relative to the number of turn-on of the second switch 2. Prevent simultaneous turn-on of the first and second switches while a value of the input current is located within the predetermined low-level current region.

This configuration results in reduction of the number of turn-on of the first switch in the low-level current region, thus resulting in lower switching loss and lower conduction loss in the first switch.

In a second exemplary aspect of the present disclosure, the low-current controller is configured to 1. Turn on any one of the first and second switches every predetermined switching cycle in a predetermined on-off pattern, the on-off pattern enabling the number of turn-on of the first switch to be greater than the number of turn-on of the second switch 2. Obtain a temperature of the first switch 3. Determine whether the temperature of the first switch is higher than a predetermined allowable upper limit 4. Change an on state of the first switch determined based on the on-off pattern of a selected switching cycle to an off state to reduce the number of times of turn-on of the first switch while changing the off state of the second switch determined based on the on-off pattern of the same switching cycle to the on state to increase the number of times of turn-on of the second switch in response to determination that the temperature of the first switch is higher than the predetermined allowable upper limit.

Under the situation where the first and second switches are turned on or off while the number of turn-on frequencies, i.e. turn-on times, of the first switch is greater than the number of turn-on frequencies, i.e. turn-on times, of the second switch, the temperature of the first switch may exceed the predetermined allowable upper limit.

In this case, the low-current controller according to the second exemplary aspect changes the on state of the first switch determined based on the on-off pattern of a selected switching cycle to an off state to reduce the number of times of turn-on of the first switch while changing the off state of the second switch determined based on the on-off pattern of the same switching cycle to the on state to increase the number of times of turn-on of the second switch in response to determination that the temperature of the first switch is higher than the predetermined allowable upper limit.

This relieves the occurrence of heat from the first switch to thereby maintaining the temperature of the first switch to be equal to or lower than the corresponding allowable upper limit while maintaining the controllability of the current caused to flow through the first and second switches. This protects the first switch against being overheated while preventing reduction in the controllability of the current caused to flow through the first and second switches.

In a third exemplary aspect of the present disclosure, the low-level current region is defined as a first low-level current region, and the low-current controller is configured to turn on only the first switch for a variable on duration and turn off the first switch if the value of the input current is located within a predetermined second low-level current region. The second low-level current region is lower than the first low-level current region.

The third exemplary aspect results in no switching loss and conduction loss in the second switch if the value of the input current is located within the second low-level current region. This results in lower switching loss and lower conduction loss in the first and second switches parallely connected to each other.

The drive control apparatus according to a fourth exemplary aspect of the present disclosure includes a high-current control unit configured to control, based on the obtained current parameter, repetitive on-off switching operations of the first and second switches to correspondingly 1. Increase the number of turn-on of the second switch relative to the number of turn-on of the first switch 2. Prevent simultaneous turn-on of the first and second switches while the value of the input current is located within a predetermined high-level current region, the high-level current region being higher than the threshold current.

In the high-level current region set to be higher than the threshold current, keeping the first switch in an off state has a lower impact on the controllability of current caused to flow through the first and second switches than turning on the first switch in a period during which the second switch is to be turned on.

From this viewpoint, the high-current control unit controls, based on the obtained current parameter, repetitive on-off switching operations of the first and second switches in the high-level current region to correspondingly 1. Increase the number of times of turn-on of the second switch relative to the number of times of turn-on of the first switch 2. Prevent simultaneous turn-on of the first and second switches while the value of the input current is located within the predetermined high-level current region.

This configuration results in reduction of the number of times of turn-on of the second switch in the high-level current region, thus resulting in lower switching loss and lower conduction loss in the second switch.

In a fifth exemplary aspect of the present disclosure, an intermediate current region is defined as a region from an upper limit of the low-level current region and a lower-limit of the high-level current region. The drive control apparatus further includes an intermediate-current controller configured to alternately turn on the first switch and the second switch every predetermined switching cycle if the value of the input current is located within the intermediate-level current region.

The on resistance of the first switch and the on resistance of the second switch do not greatly differ from each other if the value of the input current is located within the intermediate-level current region, so that loss in the first switch and loss in the second switch also do not greatly differ from each other if the value of the input current is located within the intermediate-level current region. From this viewpoint, the intermediate-current controller according to the fifth exemplary aspect alternately turns on the first switch and the second switch every predetermined switching cycle if the value of the input current is located within the intermediate-level current region. This prevents one of the first and second switches from being more frequently turned on than the other, thus preventing the temperature of one of the first and second switches from increasing. This results in lower loss of the set of the first and second switches connected in parallel to each other.

According to a sixth exemplary aspect of the present disclosure, there is provided a drive control apparatus for controlling a drive of a first switch and a second switch connected in parallel to each other. The first switch has a first on resistance, and the second switch has a second on resistance that is higher than the first on resistance in a lower range of current flowing therethrough. The lower range of current is lower than a predetermined threshold current, and the second on resistance is lower than the first on resistance in a higher range of current flowing therethrough. The higher range of current is higher than the predetermined threshold current. The drive control apparatus includes a current obtaining unit configured to obtain a current parameter indicative of an input current flowing through both the first and second switches, and a high-current control unit. The high-current control unit is configured to control, based on the obtained current parameter, repetitive on-off switching operations of the first and second switches to correspondingly 1. Increase the number of times of turn-on of the second switch relative to the number of times of turn-on of the first switch 2. Prevent simultaneous turn-on of the first and second switches while a value of the input current is located within a predetermined high-level current region, the high-level current region being higher than the threshold current.

Because the configuration of the sixth exemplary aspect of the present disclosure is substantially identical to the configuration of the fourth exemplary aspect, the sixth exemplary aspect achieves the same advantageous effects as those achieved In a seventh exemplary aspect of the present disclosure, the high-current controller is configured to 1. Turn on any one of the first and second switches every predetermined switching cycle in a predetermined on-off pattern, the on-off pattern enabling the number of turn-on of the second switch to be greater than the number of turn-on of the first switch 2. Obtain a temperature of the second switch 3. Determine whether the temperature of the second switch is higher than a predetermined allowable upper limit 4. Change an on state of the second switch determined based on the on-off pattern of a selected switching cycle to an off state to reduce the number of times of turn-on of the second switch while changing the off state of the first switch determined based on the on-off pattern of the same switching cycle to the on state to increase the number of times of turn-on of the first switch in response to determination that the temperature of the second switch is higher than the predetermined allowable upper limit.

Under the situation where the first and second switches are turned on or off while the number of times of turn-on of the second switch is greater than the number of times of turn-on of the first switch, the temperature of the second switch may exceed the predetermined allowable upper limit.

In this case, the high-current controller according to the seventh exemplary aspect changes the on state of the second switch determined based on the on-off pattern of a selected switching cycle to an off state to reduce the number of times of turn-on of the second switch while changing the off state of the first switch determined based on the on-off pattern of the same switching cycle to increase the number of times of turn-on of the first switch in response to determination that the temperature of the second switch is higher than the predetermined allowable upper limit.

This relieves the occurrence of heat from the second switch to thereby maintain the temperature of the second switch to be equal to or lower than the corresponding allowable upper limit while maintaining the controllability of the current caused to flow through the first and second switches. This protects the second switch against being overheated while preventing reduction in the controllability of the current caused to flow through the first and second switches.

In an eighth exemplary aspect of the present disclosure, the high-level current region is defined as a first high-level current region. The high-current controller is configured to simultaneously turn on the first switch and the second switch for a variable on duration and simultaneously turn off the first switch and the second switch if the value of the input current is located within a predetermined second high-level current region. The second high-level current region being higher than the first high-level current region.

The eighth exemplary aspect results in the input current to be shared between the first switch and the second switch if the value of the input current is located within the second high-level current region. This prevents the temperature of each of the first and second switches from excessively increasing. This prevents the on resistance of each of the first and second switches from excessively increasing, resulting in lower switching loss and lower conduction loss in each of the first and second switches.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more features of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which:

FIG. 7 is a graph schematically illustrating

1. The voltage-current characteristics for an MOSFET having the reference temperature 2. The voltage-current characteristics for an IGBT having the reference temperature 3. The voltage-current characteristics for an MOSFET having a temperature higher than the reference temperature 4. The voltage-current characteristics for an IGBT having a temperature higher than the reference temperature;

DETAILED DESCRIPTION OF EMBODIMENT

The following describes an exemplary embodiment of the present disclosure with reference to the accompanying drawings.

The following describes a power conversion system CS including a driving control apparatus according to the exemplary embodiment of the present disclosure with reference to the accompanying drawings.

Figure 1:
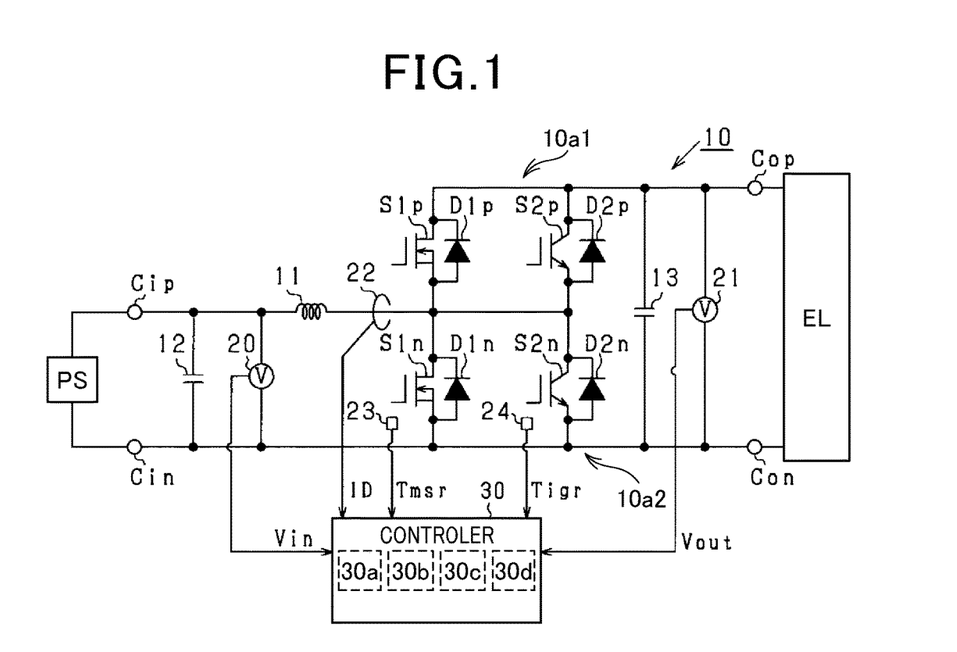
FIG. 1 is a circuit diagram schematically illustrating an overall configuration of a power conversion system according to an exemplary embodiment of the present disclosure.

Referring to FIG. 1, the power conversion system CS is installed in, for example, a vehicle. The power conversion system CS includes a booster converter, which is an example of a power converter, 10 and a control system 100 for controlling the booster converter 10.

The booster converter 10 is designed as, for example, a chopper booster, and operative to boost an output direct-current (DC) voltage from a DC power source PS, such as a battery, and output the boosted voltage to at least one electrical load EL, such as an inverter. The DC power source PS has opposite positive and negative terminals.

The booster converter 10 has a positive input terminal Cip, a negative input terminal Cin, a positive output terminal Cop, and a negative output terminal Con. The booster converter 10 includes, for example, an inductor, i.e. a reactor, 11 and a first capacitor 12. The inductor 11 has opposing first and second ends, and the first capacitor 12 has opposing first and second electrodes, i.e. first and second ends.

The first end of the inductor 11 is connected to the positive terminal of the DC power source PS via the positive input terminal Cip. The first electrode of the first capacitor 12 is connected to the positive input terminal Cip, and the second electrode of the first capacitor 12 is connected to the negative terminal of the DC power source PS via the negative input terminal Cin. This results in the first capacitor 12 being connected in parallel to the DC power source PS.

The booster converter 10 includes a first parallel connection assembly 10a1 comprised of first and second upper-arm switches S1p and S2p. The booster converter 10 also includes a second parallel connection assembly 10a2 comprised of first and second lower-arm switches S1n and S2n.

The first upper-arm switch S1p and the first lower-arm switch S1n are connected in series to each other, and the second upper-arm switch S2p and the second lower-arm switch S2n are connected in series to each other.

For example, the exemplary embodiment uses N-channel MOSFETs, which are an example of SiC devices, as the first upper- and lower-arm switches S1p and S1n. In addition, the exemplary embodiment uses IGBTs, which are an example of Si devices, as the second upper- and lower-arm switches S2p and S2n.

The booster converter 10 further includes free-wheel diodes or flywheel diodes D1p, D2p, D1n, and D2n connected in antiparallel to the respective switches S1p, S2p, S1n, and S2n. As the diodes D1p and D1n, intrinsic diodes of the MOSFETs S1p and S1n are used, but other free-wheel diodes can be used as the diodes D1p and D1n.

Figure 2:
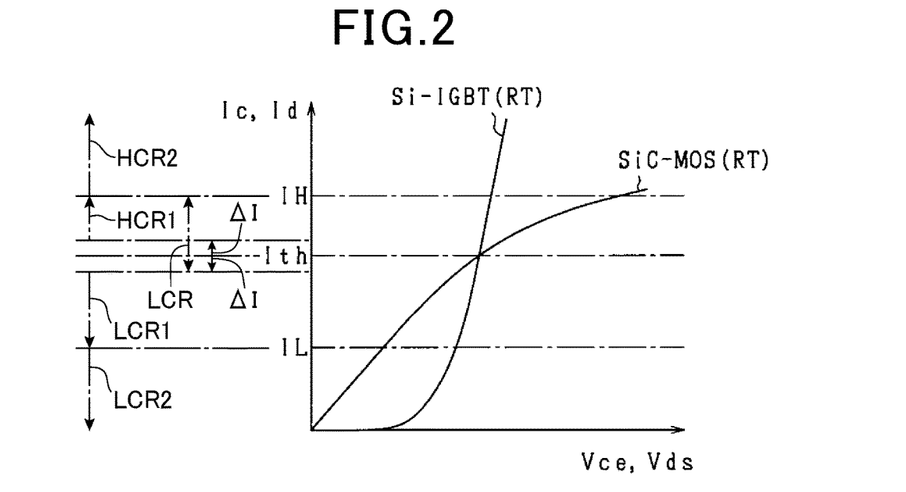
FIG. 2 is a graph schematically illustrating voltage-current characteristics between the drain-source voltage and the drain current of an MOSFET if the MOSFET has a reference temperature, and voltage-current characteristics between the collector-emitter voltage and the collector current of an IGBT if the IGBT has the reference temperature.

FIG. 2 schematically illustrates voltage-current characteristics SiC-MOS(RT) between the drain-source voltage, referred to as Vds, and the drain current, referred to as Id, of an MOSFET if the MOSFET has a reference temperature of, for example, 25° C. Similarly, FIG. 2 schematically illustrates voltage-current characteristics Si-IGBT(RT) between the collector-emitter voltage, referred to as Vce, and the collector current, referred to as Ic, of an IGBT if the IGBT has the reference temperature.

FIG. 2 shows that the drain-source voltage Vds relative to the drain current Id is lower than the collector-emitter voltage Vce relative to the collector current Ic if the drain current Id and collector current Ic are located in a second current range lower than a predetermined threshold current Ith. That is, the on resistance of the MOSFET is lower than the on resistance of the IGBT.

On the other hand, FIG. 2 shows that the collector-emitter voltage Vce relative to the collector current Ic is lower than the drain-source voltage Vds relative to the drain current Id if the drain current Id and collector current Ic are located in a first current range higher than the predetermined threshold current Ith while each of the MOSFET and IGBT has the reference temperature. That is, the on resistance of the IGBT is lower than the on resistance of the MOSFET.

Note that the maximum value of the collector current Ic that can flow through each of the second upper- and lower-arm switches S2p and S2n is higher than the maximum value of the drain current Id that can flow through each of the first upper- and lower-arm switches S1p and S1n.

The connection point between the first upper- and lower-arm switches S1p and S1n and the connection point between the second upper- and lower-arm switches S2p and S2n are connected to the second end of the inductor 11.

The drain of the first upper-arm switch S1p and the collector of the second upper-arm switch S2p are connected to the positive output terminal Cop of the booster converter 10. The source of the first lower-arm switch S1n and the emitter of the second lower-arm switch S2n are connected to the negative input and output terminals Cin and Con of the booster converter 10 via a common signal ground.

The booster converter 10 includes a second capacitor 13. The second capacitor 13 has opposing first and second electrodes, i.e. first and second ends. The first end of the second capacitor 13 is connected to the positive output terminal Cop of the booster converter 10, and the second end of the second capacitor 13 is connected to the negative output terminal Con of the booster converter 10. That is, the second capacitor 13 is connected in parallel to the pair of first upper- and lower-arm switches (S1p, S1n) and the pair of second upper- and lower-arm switches (S2p, S2n).

The at least one electrical load EL is connected to the positive and negative output terminals Cop and Con of the booster converter 10 such that the voltage boosted by the booster converter 10 is supplied to the at least one electrical load EL. The exemplary embodiment uses an inverter as an example of an electrical load; the inverter converts the DC voltage boosted by the booster converter 10 into an alternating-current (AC) voltage, and outputs the AC voltage to, for example, an unillustrated motor connected thereto. The unillustrated motor is driven based on the AC voltage to output torque.

The control system 100 includes an input voltage sensor 20, an output voltage sensor 21, a current sensor 22, a first temperature sensor 23, a second temperature sensor 24, and a controller 30.

The input voltage sensor 20 is connected across the first capacitor 12 to serve as an input voltage measuring unit.

Specifically, the input voltage sensor 20 is operative to measure the voltage across the first and second electrodes of the first capacitor 12 as an input voltage Vin to the booster converter 10. The input voltage sensor 20 is connected to the controller 30, and outputs the measured input voltage Vin to the controller 30.

The output voltage sensor 21 is connected across the second capacitor 13 to serve as an output voltage measuring unit. Specifically, the output voltage sensor 21 is operative to measure the voltage across the first and second electrodes of the second capacitor 13 as an output voltage Vout of the booster converter 10. The output voltage sensor 21 is connected to the controller 30, and outputs the measured output voltage Vout to the controller 30.

The current sensor 22 is operative to measure a current flowing through the inductor 11 as a measured current ID. The current sensor 22 is connected to the controller 30, and outputs the measured current ID to the controller 30.

Each of the first and second temperature sensors 23 and 24 is comprised of, for example, a temperature-sensitive diode. For example, the first temperature sensor 23 is disposed to be close to, for example, the first lower-arm switch S1n as a temperature detection target, and the second temperature sensor 24 is disposed to be close to, for example, the second lower-arm switch S2n as a temperature detection target. For example, the switches S1p to S2n are mounted to respective chips, and the first and second temperature sensors 23 and 24 are also mounted to the same chips as the switches S1n and S2n.

Specifically, the first temperature sensor 23 is configured to measure the temperature of the first lower-arm switch S1n as a first measured temperature Tmsr, and output a temperature measurement signal indicative of the first measured temperature Tmsr to the controller 30. Similarly, the second temperature sensor 24 is configured to measure the temperature of the second lower-arm switch S2n as a second measured temperature Tigr, and output a temperature measurement signal indicative of the second measured temperature Tigr to the controller 30.

The controller 30 is connected to the input voltage sensor 20, the output voltage sensor 21, the current sensor 22, the first temperature sensor 23, and the second temperature sensor 24. The controller 30 receives the input voltage Vin from the input voltage sensor 20, the output voltage Vout from the output voltage sensor 21, the measured current ID from the current sensor 22, the first measured temperature Tmsr from the first temperature sensor 23, and the second measured temperature Tigr from the second temperature sensor 24.

The controller 30 is essentially comprised of a microcomputer circuit including, for example, a CPU, a ROM, a RAM, and other known peripheral devices. The CPU of the controller 30 runs software programs stored in, for example, the ROM to perform various tasks.

In particular, the CPU of the controller 30 runs at least one software program stored in, for example, the ROM to perform a drive routine described later to implement at least a current obtaining unit 30a, a low-current control unit 30b, an intermediate-current control unit 30c, and a high-current control unit 30d.

These functional modules 30a to 30d can each implemented by an electronic circuit, such as a hardware unit, or can be implemented by at least one digital circuit including many logic circuits, at least one analog circuit, or at least one analog and digital hybrid circuit.

The controller 30 performs a feedback control task in a booster mode, i.e. a step-up mode, to perform on on-off control of the first and second lower-arm switches S1n and S2n while maintaining the first and second upper-arm switches S1p and S2p in an off state. This feedback control task in the boosting mode causes the output voltage Vout of the booster converter 10 to follow a target voltage Vtgt.

Specifically, the controller 30 determines a duty factor, i.e. a duty or a duty cycle, Duty of each of the first and second lower-arm switches S1n and S2n as a function of the input voltage Vin, the output voltage Vout, and the target voltage Vtgt when controlling the booster converter 10 to operate in the booster mode.

The following simply describes how the booster converter 10 is operated.

In the on state of each of the first and second lower-arm switches S1n and S2n, the inductor 11 is charged based on the DC voltage output from the DC power source PS, because the first and second upper-arm switches S1p and S2p are in the off state. Thereafter, when the first and second lower-arm switches S1n and S2n are turned off, the sum of the DC voltage output from the DC power source PS and the electrical energy charged in the inductor 11, which is boosted as compared with the DC voltage output from the DC power source PS, is supplied to the electrical load EL via the diodes D1p and D2p.

The duty factor Duty of each of the first and second lower-arm switches S1n and S2n represents the ratio of on duration Lon to the total duration of each reference switching cycle Lsw for a corresponding one of the first and second lower-arm switches S1n and S2n; the duty factor Duty is expressed as Lon/Lsw. More specifically, the controller 30 increases the duty factor Duty of each of the first and second lower-arm switches S1n and S2n with an increase of the target voltage Vtgt.

The control terminals, i.e. the gates, of the switches S1p to S2n are connected to the controller 30. The controller 30 generates drive signals D1 and D2 for the respective first and second lower-arm switches S1n and S2n based on the determined duty factors Duty of the respective first and second switches S1n and S2n. Then, the controller 30 sends the drive signals D1 and D2 to the control terminals, i.e. the gates, of the respective first and second lower-arm switches S1n and S2n, thus driving the respective first and second lower-arm switches S1n and S2n.

That is, the controller 30 controls the drive signals D1 and D2 to correspondingly control repetitive on-off switching operations of the first and second switches S1n and S2n.

In addition, the controller 30 has a predetermined first overheat threshold Tmsth that is set to an allowable upper limit temperature of the first lower-arm switch S1n; the allowable upper limit temperature represents that, if the temperature of the first lower-arm switch S1n is maintained to be equal to or lower than the allowable upper limit temperature, the reliability of the corresponding first lower-arm switch S1n is maintained. The controller 30 also has a predetermined second overheat threshold Tigth that is set to an allowable upper limit temperature of the second lower-arm switch S2n; the allowable upper limit temperature represents that, if the temperature of the second lower-arm switch S2n is maintained to be equal to or lower than the allowable upper limit temperature, the reliability of the corresponding second lower-arm switch S2n is maintained.

Figure 3:
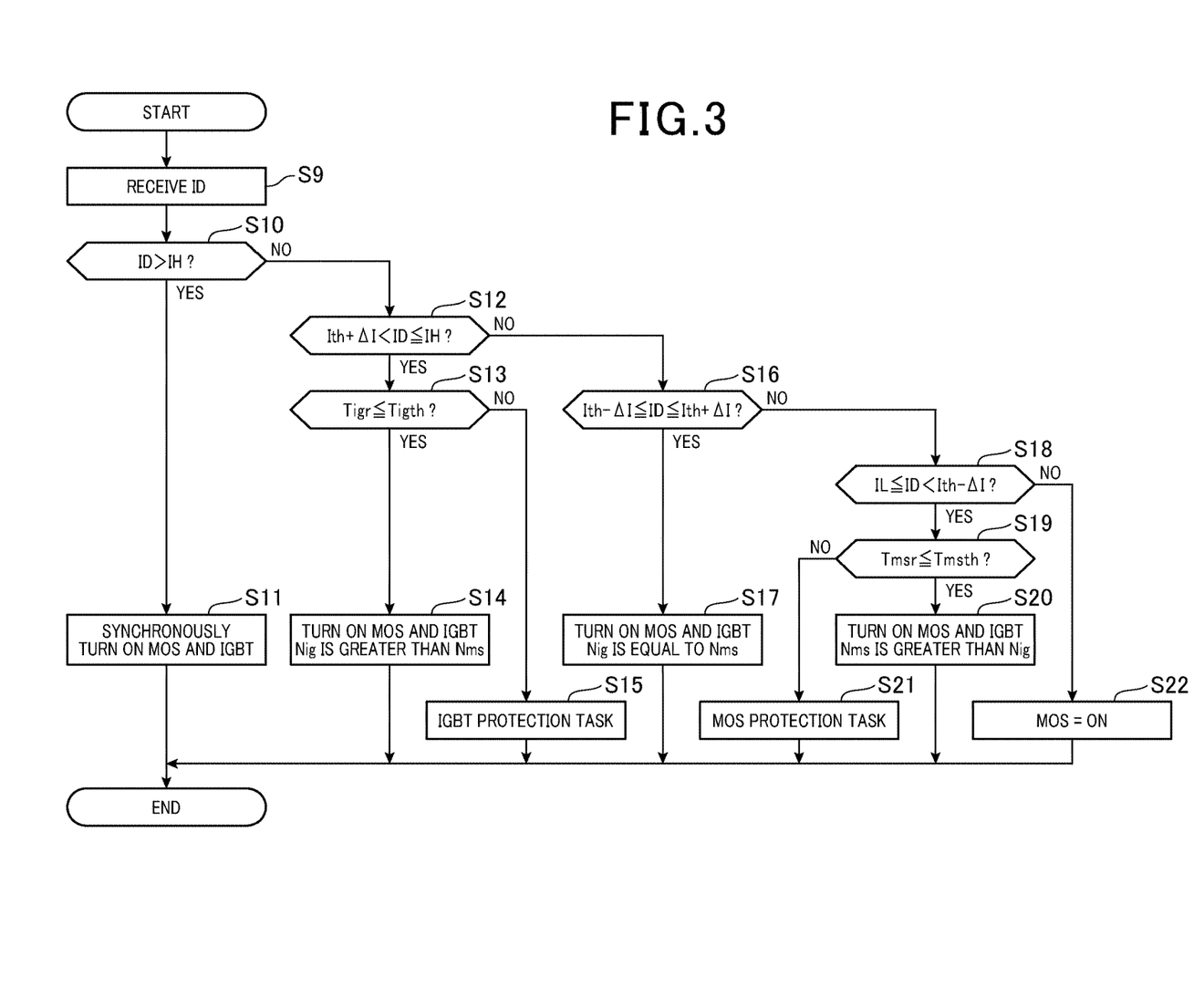
FIG. 3 is a flowchart schematically illustrating a drive routine carried out by a controller illustrated in FIG. 1.

Next, the following describes a drive routine for the first and second lower-arm switches S1n and S2n in the booster mode with reference to FIG. 3. The controller 30 is programmed to perform the drive routine in, for example, a predetermined period. In other words, the controller 30 serves as the current obtaining unit 30a, low-current control unit 30b, intermediate-current control unit 30c, and high-current control unit 30d to perform the following operations of the drive routine.

When starting the drive routine, the controller 30 serves as, for example, the current obtaining unit 30a, to receive the measured current ID indicative of the current flowing through the inductor 11 sent from the current sensor 22 in step S9. Next, in step S10, the controller 30 serves as, for example, the high-current control unit 30d to determine whether the measured current ID is higher than a predetermined high-current threshold IH. As illustrated in FIG. 2, the high-current threshold IH is set to be higher than the threshold current Ith. A current region higher than the high-current threshold IH; this current region will be defined as a second high-level current region HCR2 as illustrated in FIG. 2.

Figure 4:
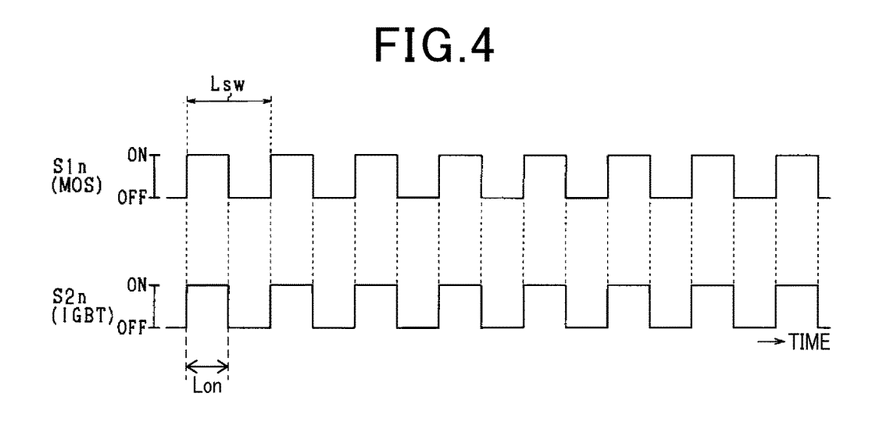
FIG. 4 is a timing chart schematically illustrating how first and second lower-arm switches are driven over time if a measured current is higher than a high-current threshold.

Upon determination that the measured current ID is higher than the high-current threshold IH (YES in step S10), the controller 30 serves as, for example, the high-current control unit 30d to synchronously turn on the first and second lower-arm switches S1n and S2n, and synchronously turn off the first and second lower-arm switches S1n and S2n after lapse of the on duration Lon in each reference switching cycle Lsw in step S11 (see FIG. 4). This enables the current ID supplied from the inductor 11 to be divided into both the first and second lower-arm switches S1n and S2n in the second high-level current region HCR2. In other words, this enables the first and second lower-arm switches S1n and S2n to share the current ID supplied from the inductor 11 in the second high-level current region HCR2. This therefore results in reduction of conduction loss of each of the first and second lower-arm switches S1n and S2n.

Otherwise, upon determination that the measured current ID is equal to or lower than the high-current threshold IH (NO in step S10), the controller 30 serves as, for example, the high-current control unit 30d to determine whether the measured current ID is higher than the sum of the threshold current Ith and a predetermined value ΔI that is a positive current value, and is equal to or lower than the high-current threshold IH in step S12. A current region higher than the sum of the threshold current Ith and the predetermined value ΔI, which is expressed by (Ith+ΔI), and equal to or lower than the high-current threshold IH; this current region will be defined as a first high-level current region HCR1 as illustrated in FIG. 2.

Upon determination that the measured current ID is higher than the sum of the threshold current Ith and the predetermined value ΔI and is equal to or lower than the high-current threshold IH (YES in step S12), the controller 30 serves as, for example, the high-current control unit 30d to receive the second measured temperature Tigr indicative of the temperature of the second lower-arm switch S2n in step S13. Then, in step S13, the controller 30 serves as, for example, the high-current control unit 30d to determine whether the second measured temperature Tigr is equal to or lower than the second overheat threshold Tigth set forth above.

Upon determination that the second measured temperature Tigr is equal to or lower than the second overheat threshold Tigth (YES in step S13), the drive routine proceeds to step S14.

Figure 5:
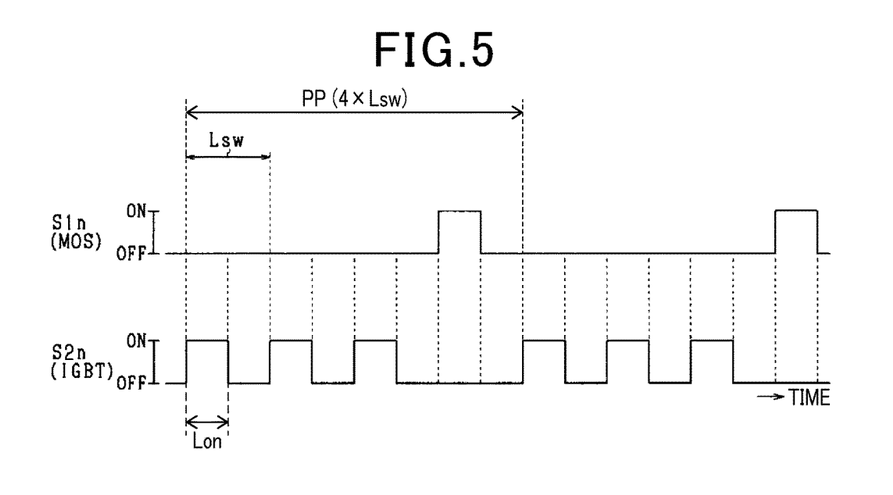
FIG. 5 is a timing chart schematically illustrating how the first and second lower-arm switches are driven over time if a second measured temperature is equal to or lower than a second overheat threshold.

In step S14, the controller 30 serves as, for example, the high-current control unit 30d to cause that the number of times of turn-on of the second lower-arm switch S2n, which is referred to as Nig, to be greater than the number of times of turn-on of the first lower-arm switch S1n, which is referred to as Nms in each predetermined period longer than the reference switching cycle Lsw while preventing simultaneous turn-on of the first and second lower-arm switches S1n and S2n in the reference switching cycle Lsw in the first high-level current region HCR1 (see FIG. 5).

In particular, the controller 30 serves as, for example, the high-current control unit 30d to 1. Turn on any one of the first and second lower-arm switches S1n and S2n 2. Turn off the corresponding one of the first and second lower-arm switches S1n and S2n after lapse of the on duration Lon in each reference switching cycle Lsw 3. Increase the number of times of turn-on of the second lower-arm switch S2n, which is referred to as Nig, more than the number of turn-on of the first lower-arm switch S1n, which is referred to as Nms in each predetermined period longer than the reference switching cycle Lsw in the first high-level current region HCR1 (see FIG. 5)

In other words, the controller 30 causes, in the first high-level current region HCR1, the number Nig of turn-on of the second lower-arm switch S2n to be greater than the number Nms of turn-on of the first lower-arm switch S1n in each predetermined period PP longer than the reference switching cycle Lsw while turning on any one of the first and second lower-arm switches S1n and S2n during the on duration Lon in each reference switching cycle Lsw.

In particular, the controller 30 sets the predetermined period PP to the product of the reference switching cycle Lsw and a predetermined integer M equal to or more than 2, which is expressed by "Lsw×M". The exemplary embodiment sets the integer M to 4, i.e. the predetermined period PP is set to the value (Lsw×4).

The operation in step S14 enables the number of times of turn-on of the second lower-arm switch S2n in the first high-level current region HCR1 to be smaller than the number of times of turn-on of the second lower-arm switch S2n in the second high-level current region HCR2, thus holding down an increase of the temperature of the second lower-arm switch S2n. This results in lower switching loss and conduction loss of the second lower-arm switch S2n.

Otherwise, upon determination that the second measured temperature Tigr is higher than the second overheat threshold Tigth (NO in step S13), the drive routine proceeds to step S15.

As described above, the controller 30 serves as, for example, the high-current control unit 30d to turn on any one of the first and second lower-arm switches S1n and S2n every reference switching cycle Lsw in a predetermined on-off pattern that enables the number Nig of turn-on of the second lower-arm switch S2n in each predetermined period PP to be greater than the number of times of turn-on of the first lower-arm switch S1n.

At that time, in step S15, the controller 30 reduces the number Nig of turn-on of the second lower-arm switch S2n while increasing the corresponding number Nms of turn-on of the first lower-arm switch S1n in the corresponding predetermined period.

Specifically, in step S15, the controller 30 serves as, for example, the high-current control unit 30d to change the on state of the second lower-arm switch S2n during at least one reference switching cycle Lsw in each predetermined period PP to the off state while changing the off state of the first lower-arm switch S1n to the on state in the at least one reference switching cycle Lsw.

Figure 6:
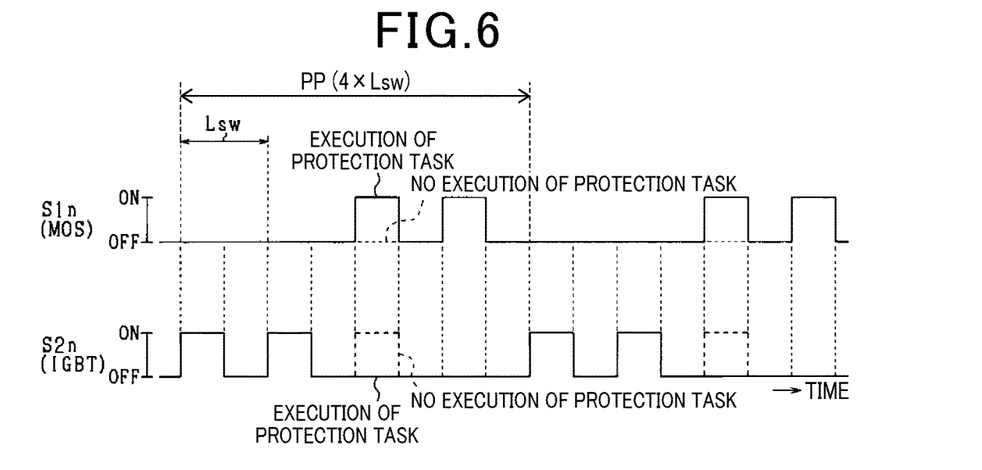
FIG. 6 is a timing chart schematically illustrating how the first and second lower-arm switches are driven over time if the second measured temperature is higher than the second overheat threshold.

For example, as illustrated in FIG. 6, the controller 30 reduce the number Nig of turn-on of the second lower-arm switch S2n by one in a reference switching cycle Lsw in each predetermined period PP while increasing the corresponding number Nms of turn-on of the first lower-arm switch S1n by one in the corresponding reference switching cycle Lsw in the corresponding predetermined period PP.

The operation in step S15 serves as a protection task of the second lower-arm switch S2n. That is, the protection task in step S15 aims to hold down an increase of the second lower-arm switch S2n to correspondingly prevent the on resistance of the second lower-arm switch S2n from excessively increasing.

Figure 7:
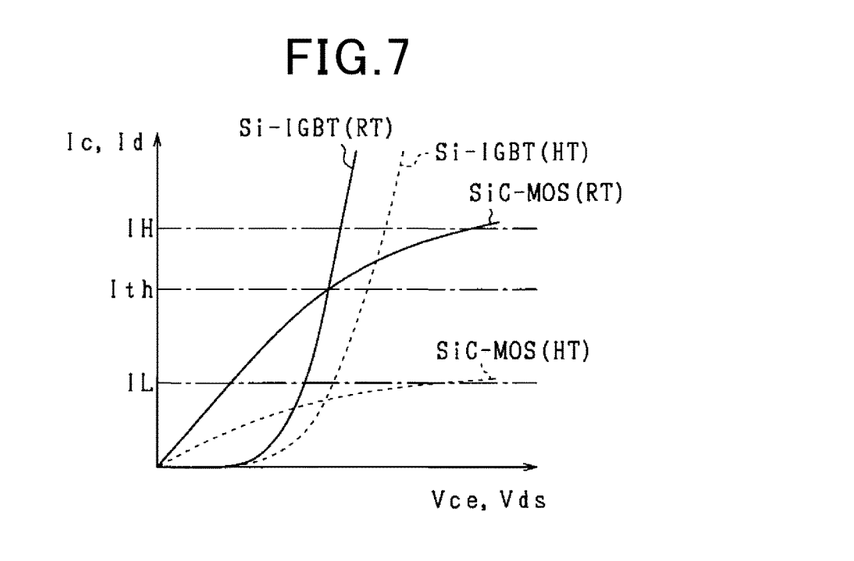

FIG. 7 schematically illustrates, by solid line, each of the voltage-current characteristics SiC-MOS(RT) between the drain-source voltage Vds and the drain current Id of an MOSFET, and the voltage-current characteristics Si-IGBT (RT) between the collector-emitter voltage Vce and the collector current Ic of an IGBT if each of the MOSFET and IGBT has the reference temperature.

In addition, FIG. 7 schematically illustrates, by dashed line, voltage-current characteristics Si-IGBT(HT) between the collector-emitter voltage Vce and the collector current Ic of an IGBT, such as the second lower-arm switch S2n, if each of the IGBT has a temperature higher than the reference temperature.

FIG. 7 shows that, if the temperature of the second lower-arm switch S2n increases to be higher than the reference temperature, the on resistance of the second lower-arm switch S2n becomes higher than the on resistance of the second lower-arm switch S2n at the reference temperature.

The controller 30 continuously carries out the protection task in step S15, i.e. repeatedly carries out the drive task so as to repeatedly carry out the protection task in step S15, until the second measured temperature Tigr is higher than the second overheat threshold Tigth, i.e. the determination in step S13 is negative.

This relieves the occurrence of heat generated from the second lower-arm switch S2n, thus maintaining the temperature of the second lower-arm switch S2n to be equal to or lower than the second overheat threshold Tigth.

Note that the controller 30 can repeatedly carry out the drive task so as to repeatedly carry out the protection task in step S15 until the second measured temperature Tigr is equal to or lower than a predetermined second release temperature that is lower than the second overheat threshold Tigth in step S13.

Otherwise, upon determination that the measured current ID is equal to or lower than the sum (Ith+ΔI) of the threshold current Ith and the predetermined value ΔI (NO in step S12), the controller 30 serves as, for example, the intermediate-current control unit 30c to determine whether the measured current ID is equal to or higher than the subtraction of the predetermined value ΔI from the threshold current Ith, which is expressed by (Ith−ΔI), and is equal to or lower than the sum (Ith+ΔI) of the threshold current Ith and the predetermined value ΔI in step S16. A current region equal to or higher than the subtraction (Ith−ΔI) of the predetermined value ΔI from the threshold current Ith and equal to or lower than the sum (Ith+ΔI) of the threshold current Ith and the predetermined value ΔI will be referred to as an intermediate-level current region ICR. In other words, the intermediate-level current region is defined as a region from an upper limit of the first low-level current region LCR1 and a lower limit of the first high-level current region HCR1.

Upon determination that the measured current ID is equal to or higher than the subtraction (Ith−ΔI) of the predetermined value ΔI from the threshold current Ith and equal to or lower than the sum (Ith+ΔI) of the threshold current Ith and the predetermined value ΔI (YES in step S16), the drive routine proceeds to step S17.

Figure 8:
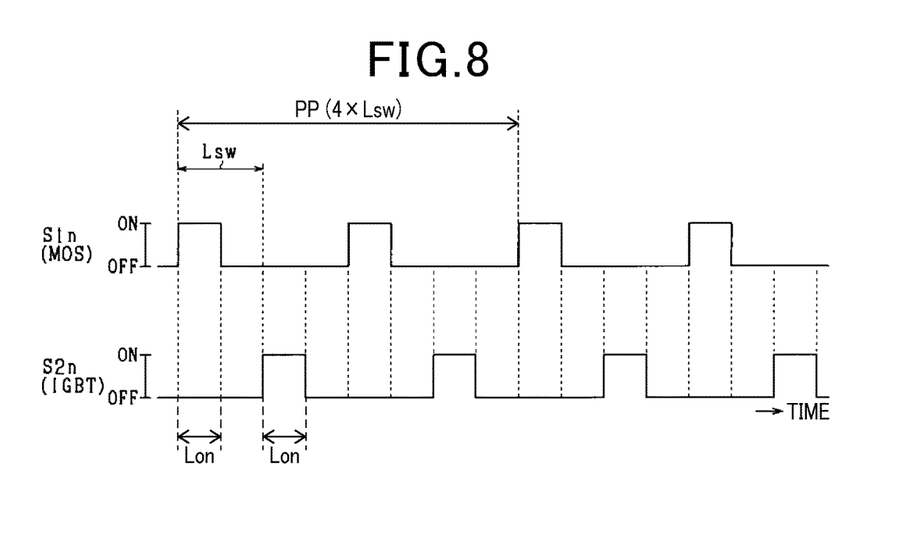
FIG. 8 is a timing chart schematically illustrating how the first and second lower-arm switches are driven over time if the measured current is equal to or higher than a subtraction of a predetermined value from a threshold current and equal to or lower than the sum of the threshold current and the predetermined value.

In step S17, the controller 30 alternately turns on the first lower-arm switch S1n and the second lower-arm switch S2n by the on duration Lon every reference switching cycle Lsw in accordance with FIG. 8. This enables the number Nms of turn-on of the first lower-arm switch S1n and the number Nig of turn-on of the second lower-arm switch S2n in the predetermined period PP to be identical to each other.

Otherwise, upon determination that the measured current ID is lower than the subtraction (Ith−ΔI) of the predetermined value ΔI from the threshold current Ith (NO in step S16), the drive routine proceeds to step S18.

In step S18, the controller 30 serves as, for example, the low-current control unit 30b to determine whether the measured current ID is equal to or higher than a predetermined low-current threshold IL, and lower than the subtraction (Ith−ΔI) of the predetermined value ΔI from the threshold current Ith in step S18. As illustrated in FIG. 2, the low-current threshold IL is set to be lower than the threshold current Ith. A current region equal to or higher than the predetermined low-current threshold IL and lower than the subtraction (Ith−ΔI) of the predetermined value ΔI from the threshold current Ith will be referred to as a first low-level current region LCR1.

Upon determination that the measured current ID is equal to or higher than the low-current threshold IL, and lower than the subtraction (Ith−ΔI) of the predetermined value ΔI from the threshold current Ith (YES in step S18), the controller 30 serves as, for example, the low-current control unit 30b to receive the first measured current Tmsr indicative of the temperature of the first lower-arm switch S1n in step S19. Then, in step S19, the controller 30 serves as, for example, the low-current control unit 30b to determine whether the first measured temperature Tmsr is equal to or lower than the first overheat threshold Tmsth set forth above. Note that the first overheat threshold Tmsth can be set to be equal to or different from the second overheat threshold Tmsth.

Upon determination that the first measured temperature Tmsr is equal to or lower than the first overheat threshold Tmsth (YES in step S19), the drive routine proceeds to step S20.

Figure 9:
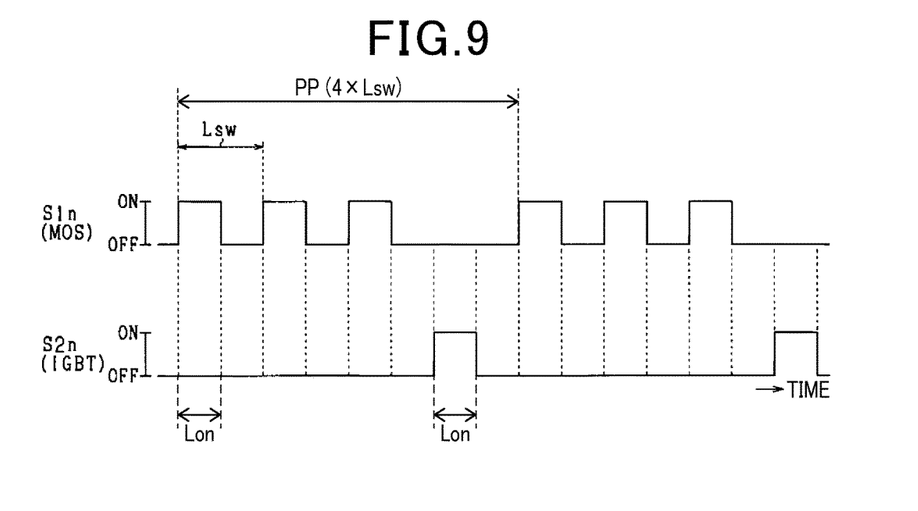
FIG. 9 is a timing chart schematically illustrating how the first and second lower-arm switches are driven over time if a first measured temperature is equal to or lower than a first overheat threshold.

In step S20, the controller 30 serves as, for example, the low-current control unit 30b to set the number Nms of turn-on of the first lower-arm switch S1n being greater than the number Nig of turn-on of the second lower-arm switch S2n in each predetermined period PP while preventing simultaneous turn-on of the first and second lower-arm switches S1n and S2n in each reference switching cycle Lsw in the first low-level current region LCR1 (see FIG. 9).

In particular, the controller 30 serves as, for example, the low-current control unit 30b to 1. Turn on any one of the first and second lower-arm switches S1n and S2n to there 2. Turn off the corresponding one of the first and second lower-arm switches S1n and S2n after lapse of the on duration Lon in each reference switching cycle Lsw 3. Increase the number Nms of turn-on of the first lower-arm switch S1n more than the number Nig of turn-on of the second lower-arm switch S2n in each predetermined period PP in the first low-level current region LCR1 (see FIG. 9)

In other words, the controller 30 causes, in the first low-level current region LCR1, the number Nms of turn-on of the first lower-arm switch S1n to be greater than the number Nig of turn-on of the second lower-arm switch S2n in each predetermined period PP while turning on any one of the first and second lower-arm switches S1n and S2n during the on duration Lon in each reference switching cycle Lsw.

In particular, the controller 30 sets the predetermined period PP to the value (Lsw×4) as described above.

The operation in step S20 enables the number of times of turn-on of the first lower-arm switch S1n in the first low-level current region LCR1 to be smaller than the number of times of turn-on of the first lower-arm switch S1n if the first lower-arm switch S1n is turned on every reference switching cycle Lsw. This results in lower switching loss and conduction loss of the first lower-arm switch S1n.

Otherwise, upon determination that the first measured temperature Tmsr is higher than the first overheat threshold Tmsth (NO in step S19), the drive routine proceeds to step S21.

As described above, the controller 30 serves as, for example, the low-current control unit 30b to turn on any one of the first and second lower-arm switches S1n and S2n every reference switching cycle Lsw in a predetermined on-off pattern that enables the number Nms of turn-on of the first lower-arm switch S1n in each predetermined period PP to be greater than the number of times of turn-on of the second lower-arm switch S2n.

At that time, in step S21, the controller 30 reduces the number Nms of turn-on of the first lower-arm switch S1n while increasing the corresponding number Nig of turn-on of the second lower-arm switch S2n in the corresponding predetermined period.

Specifically, the controller 30 serves as, for example, the low-current control unit 30b to change the on state of the first lower-arm switch S1n during at least one reference switching cycle Lsw in each predetermined period PP while changing the off state of the second lower-arm switch S2n to the on state in the at least one reference switching cycle Lsw.

Figure 10:
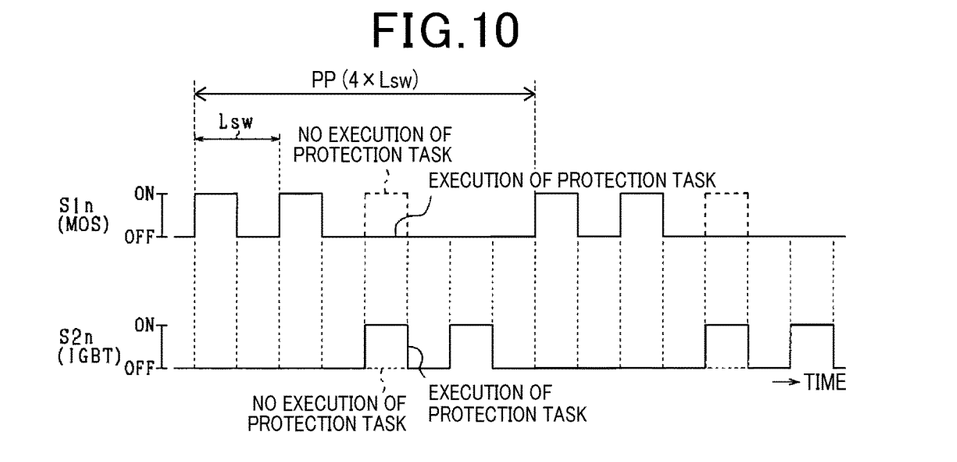
FIG. 10 is a timing chart schematically illustrating how the first and second lower-arm switches are driven over time if the first measured temperature is higher than the first overheat threshold.

For example, as illustrated in FIG. 10, the controller 30 reduce the number Nms of turn-on of the first lower-arm switch S1n by one in a reference switching cycle Lsw in each predetermined period PP while increasing the corresponding number Nig of turn-on of the second lower-arm switch S2n by one in the corresponding reference switching cycle Lsw in the corresponding predetermined period PP.

The operation in step S21 serves as a protection task of the first lower-arm switch S1n. That is, the protection task in step S21 aims to hold down an increase of the first lower-arm switch S1n to correspondingly prevent the on resistance of the first lower-arm switch S1n from excessively increasing.

FIG. 7 schematically illustrates, by dashed line, voltage-current characteristics SiC-MOS(HT) between the drain-source voltage Vds and the drain current Id of an MOSFET, such as the first lower-arm switch S1n, if the MOSFET has a temperature higher than the reference temperature.

FIG. 7 shows that, if the temperature of the first lower-arm switch S1n increases to be higher than the reference temperature, the on resistance of the first lower-arm switch S1n becomes higher than the on resistance of the first lower-arm switch S1n at the reference temperature.

The controller 30 continuously carries out the protection task in step S21, i.e. repeatedly carries out the drive task so as to repeatedly carry out the protection task in step S21, until the first measured temperature Tms is higher than the first overheat threshold Tmsth, i.e. the determination in step S19 is negative.

This relieves the occurrence of heat from the first lower-arm switch S1n, thus maintaining the temperature of the first lower-arm switch S1n to be equal to or lower than the first overheat threshold Tmsth.

Note that the controller 30 can repeatedly carry out the drive task so as to repeatedly carry out the protection task in step S21 until the first measured temperature Tms is equal to or lower than a predetermined first release temperature that is lower than the first overheat threshold Tmsth in step S19.

Otherwise, upon determination that the measured current ID is lower than the low-current threshold IL (NO in step S18), the drive routine proceeds to step S22. A current region lower than the low-current threshold IL will be defined as a second low-level current region LCR2 as illustrated in FIG. 2.

Figure 11:
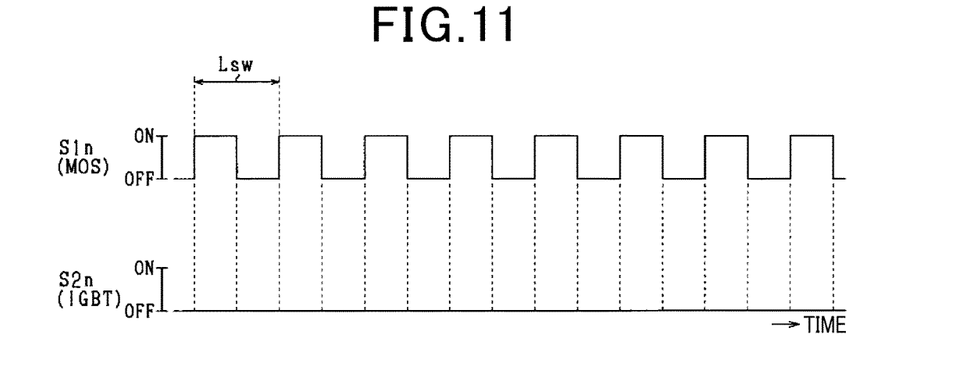
FIG. 11 is a timing chart schematically illustrating how the first and second lower-arm switches are driven over time if the measured current is lower than a low-current threshold.

In step S22, the controller 30 serves as, for example, the low-current control unit 30b to turn on only the first lower-arm switch S1n and turn off the first lower-arm switch S1n after lapse of the on duration Lon in each reference switching cycle Lsw in step S22 (see FIG. 11).

The power conversion CS according to the exemplary aspect of the present disclosure is configured to control, in the first low-level region LCR1, on-off operations of the first and second lower-arm switches S1n and S2n to cause the number Nms of turn-on of the first lower-arm switch S1n to be greater than the number Nig of turn-on of the second lower-arm switch S2n in each predetermined period PP while preventing simultaneous turn-on of the first and second lower-arm switches S1n and S2n in each reference switching cycle Lsw in the first low-level current region LCR1 (see FIG. 9).

That is, this configuration prevents the first lower-arm switch (MOSFET) S1n from being always turned on every reference switching cycle Lsw in the first low-level region LCR1 in comparison to the drive control apparatus disclosed in the published patent document, which always turns on the MOSFET every switching period. This holds down an increase of the temperature of the first lower-arm switch (MOSFET) S1n, thus curbing an increase of the on resistance of the first lower-arm switch S1n.

In addition, the power conversion CS according to the exemplary aspect of the present disclosure is configured to control, in the first high-level region HCR1, on-off operations of the first and second lower-arm switches S1n and S2n to increase the number Nig of turn-on of the second lower-arm switch S2n more than the number Nms of turn-on of the first lower-arm switch S1n in each predetermined period PP while preventing simultaneous turn-on of the first and second lower-arm switches S1n and S2n in each reference switching cycle Lsw in the first high-level current region HCR1 (see FIG. 5).

That is, this configuration prevents the second lower-arm switch (IGBT) S2n from being always turned on every reference switching cycle Lsw in the first high-level region HCR1 in comparison to the drive control apparatus disclosed in the published patent document, which always turns on the IGBT every switching period. This holds down an increase of the temperature of the second lower-arm switch (IGBT) S2n, thus curbing an increase of the on resistance of the second lower-arm switch S2n.

This configuration therefore results in lower switching loss and lower conduction loss of the booster converter 10.

The present disclosure is not limited to the aforementioned embodiment, and can be modified within the scope thereof.

The controller 30 according to the exemplary embodiment performs the feedback control task in the booster mode to perform on on-off control of the first and second lower-arm switches S1n and S2n while maintaining the first and second upper-arm switches S1p and S2p in the off state, but the present disclosure is not limited thereto.

Specifically, the controller 30 of the booster converter 10 according a modification can be configured to perform the feedback control task in the booster mode to (1) Perform the on-off control of the first and second lower-arm switches S1n and S2n in accordance with the exemplary embodiment set forth above while the second upper-arm switch S2p is in the off state (2) Complementarily turn on the first upper-arm switch S1p while the first lower-arm switch S1n is turned off, and turn off the first upper-arm switch S1p while the first lower-arm switch S1n is turned on The following simply describes how the booster converter 10 according to this modification is operated.

In the on state of each of the first and second lower-arm switches S1n and S2n, the inductor 11 is charged based on the DC voltage output from the DC power source PS, because the first and second upper-arm switches S1p and S2p are in the off state.

Thereafter, when the first and second lower-arm switches S1n and S2n are turned off, the sum of the DC voltage output from the DC power source PS and the electrical energy charged in the inductor 11, which is boosted as compared with the DC voltage output from the DC power source PS, is supplied to the electrical load EL via the first upper-arm switch S1p, because the first upper-arm switch S1p is in the on state.

Because the on resistance of the first upper-arm switch S1p, i.e. the MOSFET, is lower than the on resistance of the diode D1p, this modification further results in lower switching loss and lower conduction loss of the booster converter 10.

The booster converter 10 can be operative to step down an output voltage from the positive and negative output terminals Cop and Con, and output the stepped-down voltage to the positive and negative input terminals Cip and Cin.

Specifically, the controller 30 can perform a feedback control task in a step-down mode to perform on on-off control of the first and second upper-arm switches S1p and S2p while maintaining the first and second lower-arm switches S1n and S2n in the off state. This feedback control task in the step-down mode causes the stepped-down voltage to follow a target voltage. That is, in the step-down mode, the controller 30 performs the drive routine illustrated in FIG. 3 when controlling the first and second upper-arm switches S1p and S2p.

Like the booster mode, the controller 30 of the booster converter 10 according a modification can be configured to perform the feedback control task in the step-down mode to (1) Perform the on-off control of the first and second upper-arm switches S1p and S2p while maintaining the second lower-arm switch S2n in the off state in accordance with the exemplary embodiment set forth above (2) Complementarily turn on the first lower-arm switch S1n while the first upper-arm switch S1p is turned off, and turn off the first lower-arm switch S1n while the first upper-arm switch S1p is turned on Because the on resistance of the first lower-arm switch S1n, i.e. the MOSFET, is lower than the on resistance of the diode D1n, this modification further results in lower switching loss and lower conduction loss of the booster converter 10.

The exemplary embodiment measures, as the current ID flowing through the inductor 11, the total current flowing through both the first and second lower-arm switches S1n and S2n using the current sensor 22, and uses the measured total current in the drive routine illustrated in FIG. 3, but the present disclosure is not limited thereto.

If the first and the second upper-arm switches S1p and S2p and the first and second lower-arm switches S1n and S2n, which constitute the booster converter 10, are cooled by a coolant circulated in an unillustrated cooler. In this modification, the controller 30 can obtain the temperature of the coolant as a current parameter indicative of the current flowing through the first and second lower-arm switches S1n and S2n in place of the measured value of the current ID; the temperature of the coolant has a positive correlation with the current flowing through the first and second lower-arm switches S1n and S2n. Similarly, the controller 30 can obtain the flow rate of the coolant as a current parameter indicative of the current flowing through the first and second lower-arm switches S1n and S2n in place of the measured value of the current ID; the flow rate of the coolant has a negative correlation with the current flowing through the first and second lower-arm switches S1n and S2n.

The exemplary embodiment can eliminate the operations in steps S16 and S17. In this modification, the controller 30 carries out the operation in step S18 upon the determination in step S12 being negative. In this modification, the determination in step S12 is changed to the determination of whether the measured current ID is equal to or higher than the threshold current Ith and is equal to or lower than the high-current threshold IH, which is expressed by (Ith≤ID≤IH). Moreover, in this modification, the determination in step S18 is changed to the determination of whether the measured current ID is equal to or higher than the low-current threshold IL and is lower than the threshold current Ith, which is expressed by (IL≤ID≤Ith).

Each of the first and second temperature sensors 23 and 24 can be comprised of another temperature-sensitive device, such as a thermistor.

The number of upper-arm switches and the number of lower-arm switches, which constitute the booster converter 10, are not limited to two, can be set to three or more. If three or more upper-arm switches and the corresponding three or more lower-arm switches are used to constitute the booster convert 10, the number of MOSFET(s) and number of IGBT(s) in the upper-arm switches can be different from the number of MOSFET(s) and number of IGBT(s) in the lower-arm switches.

The exemplary embodiment is configured such that the intermediate-level current region ICR is defined as the range from the subtraction (Ith−ΔI) of the predetermined value ΔI from the threshold current Ith to the sum (Ith+ΔI) of the threshold current Ith and the predetermined value ΔI inclusive, but the present invention is not limited thereto. Specifically, a first value ΔI1, which is a positive current value, and a second value ΔI2, which is a positive current value, can be defined, and the intermediate-level current region ICR can be defined as the range from the subtraction (Ith−ΔI1) of the first value ΔI1 from the threshold current Ith to the sum (Ith+ΔI2) of the threshold current Ith and the second value ΔI2 inclusive.

The exemplary embodiment uses the booster converter 10 comprised of switches connected in parallel to each other as a power converter, but can use another type of power converter operative to convert an input voltage into a predetermined output voltage, such as an inverter for converting an input DC voltage into a predetermined alternating-current (AC) voltage, or a step-down DC-DC converter.

As described above, a pair of an MOSFET and an IGBT is used as a pair of a first switch and a second switch connected in parallel to each other, but the present disclosure is not limited thereto. The present disclosure can use a pair of a first switch and a second switch connected in parallel to each other in which
1. The first switch has a first on resistance
2. The second switch has a second on resistance that is higher than the first on resistance in a first region of current flowing therethrough
3. The first region of current is lower than a predetermined threshold current
4. The second on resistance is lower than the first on resistance in a second region of current flowing therethrough
5. The second current region is higher than the predetermined threshold current While the illustrative embodiment and its modifications of the present disclosure have been described herein, the present disclosure is not limited to the embodiment and its modifications described herein. Specifically, the present disclosure includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A drive control apparatus for controlling a drive of a first switch and a second switch connected in parallel to each other, the first switch having a first on resistance, the second switch having a second on resistance that is higher than the first on resistance in a lower range of current flowing therethrough, the lower range of current being lower than a predetermined threshold current, the second on resistance being lower than the first on resistance in a higher range of current flowing therethrough, the higher range of current being higher than the predetermined threshold current, the drive control apparatus comprising:
   a current obtaining unit configured to obtain a current parameter indicative of an input current flowing through both the first and second switches; and
   a low-current control unit configured to control, based on the obtained current parameter, on-off switching operations of the first and second switches to correspondingly:
      increase the number of times of turn-on of the first switch relative to the number of times of turn-on of the second switch; and
      prevent simultaneous turn-on of the first and second switches while a value of the input current is located within a predetermined low-level current region, the low-level current region being lower than the threshold current.

2. The drive control apparatus according to claim 1, wherein:
   the low-current controller is configured to:
      turn on any one of the first and second switches every predetermined switching cycle in a predetermined on-off pattern, the on-off pattern enabling the number of times of turn-on of the first switch to be greater than the number of times of turn-on of the second switch;
      obtain a temperature of the first switch;
      determine whether the temperature of the first switch is higher than a predetermined allowable upper limit; and
      change an on state of the first switch determined based on the on-off pattern of a selected switching cycle to an off state to reduce the number of times of turn-on of the first switch while changing the off state of the second switch determined based on the on-off pattern of the same switching cycle to the on state to increase the number of times of turn-on of the second switch in response to determination that the temperature of the first switch is higher than the predetermined allowable upper limit.

3. The drive control apparatus according to claim 1, wherein:
   the low-level current region is defined as a first low-level current region; and
   the low-current controller is configured to turn on only the first switch for a variable on duration and turn off the first switch if the value of the input current is located within a predetermined second low-level current region, the second low-level current region being lower than the first low-level current region.

4. The drive control apparatus according to claim 1, further comprising:
   a high-current control unit configured to control, based on the obtained current parameter, on-off switching operations of the first and second switches to correspondingly:
      increase the number of times of turn-on of the second switch relative to the number of times of turn-on of the first switch; and
      prevent simultaneous turn-on of the first and second switches while the value of the input current is located within a predetermined high-level current region, the high-level current region being higher than the threshold current.

5. The drive control apparatus according to claim 4, wherein:
   an intermediate current region is defined as a region from an upper limit of the low-level current region and a lower-limit of the high-level current region,
   the drive control apparatus further comprising:
   an intermediate-current controller configured to alternately turn on the first switch and the second switch every predetermined switching cycle if the value of the input current is located within the intermediate-level current region.

6. A drive control apparatus for controlling a drive of a first switch and a second switch connected in parallel to each other, the first switch having a first on resistance, the second switch having a second on resistance that is higher than the first on resistance in a lower range of current flowing therethrough, the lower range of current being lower than a predetermined threshold current, the second on resistance being lower than the first on resistance in a higher range of current flowing therethrough, the higher range of current being higher than the predetermined threshold current, the drive control apparatus comprising:
   a current obtaining unit configured to obtain a current parameter indicative of an input current flowing through both the first and second switches; and
   a high-current control unit configured to control, based on the obtained current parameter, repetitive on-off switching operations of the first and second switches to correspondingly:
      increase the number of times of turn-on of the second switch relative to the number of times of turn-on of the first switch; and prevent simultaneous turn-on of the first and second switches while a value of the input current is located within a predetermined high-level current region, the high-level current region being higher than the threshold current.

7. The drive control apparatus according to claim 6, wherein:
the high-current controller is configured to:
turn on any one of the first and second switches every predetermined switching cycle in a predetermined on-off pattern, the on-off pattern enabling the number of times of turn-on of the second switch to be greater than the number of times of turn-on of the first switch;
obtain a temperature of the second switch;
determine whether the temperature of the second switch is higher than a predetermined allowable upper limit; and
change an on state of the second switch determined based on the on-off pattern of a selected switching cycle to an off state to reduce the number of times of turn-on of the second switch while changing the off state of the first switch determined based on the on-off pattern of the same switching cycle to the on state to increase the number of times of turn-on of the first switch in response to determination that the temperature of the second switch is higher than the predetermined allowable upper limit.

8. The drive control apparatus according to claim 6, wherein:
the high-level current region is defined as a first high-level current region; and
the high-current controller is configured to simultaneously turn on the first switch and the second switch for a variable on duration and simultaneously turn off the first switch and the second switch if the value of the input current is located within a predetermined second high-level current region, the second high-level current region being higher than the first high-level current region.

* * * * *